(12) United States Patent
Seo et al.

(10) Patent No.: US 10,762,938 B2
(45) Date of Patent: Sep. 1, 2020

(54) SEMICONDUCTOR DEVICE

(71) Applicant: SK hynix Inc., Icheon-si Gyeonggi-do (KR)

(72) Inventors: Jae Hwan Seo, Icheon-si (KR); Sung Soo Chi, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/232,920

(22) Filed: Dec. 26, 2018

(65) Prior Publication Data

US 2020/0111517 A1 Apr. 9, 2020

(30) Foreign Application Priority Data

Oct. 4, 2018 (KR) .................. 10-2018-0118040

(51) Int. Cl.
*G11C 5/06* (2006.01)
*G11C 8/10* (2006.01)
*H01L 27/105* (2006.01)
*G11C 5/02* (2006.01)
*H01L 27/092* (2006.01)
*H01L 27/02* (2006.01)
*H01L 23/528* (2006.01)

(52) U.S. Cl.
CPC .............. *G11C 8/10* (2013.01); *G11C 5/025* (2013.01); *H01L 23/5286* (2013.01); *H01L 27/0207* (2013.01); *H01L 27/092* (2013.01); *H01L 27/1052* (2013.01)

(58) Field of Classification Search
CPC ....... G11C 8/10; G11C 5/025; G01L 23/5286; G01L 27/0207; G01L 27/092; G01L 27/1052

USPC .................. 365/63, 230.03, 230.06
See application file for complete search history.

(56) References Cited

U.S. PATENT DOCUMENTS

| | | | | | |
|---|---|---|---|---|---|
| 5,940,315 | A | * | 8/1999 | Cowles | G11C 5/063 365/230.03 |
| 6,028,811 | A | * | 2/2000 | Brown | G11C 8/12 365/230.03 |
| 6,064,618 | A | * | 5/2000 | Kuriyama | G11C 5/025 365/230.03 |
| 6,081,450 | A | * | 6/2000 | Nawaki | G11C 8/14 365/185.11 |
| 6,097,660 | A | * | 8/2000 | Tsuchida | G11C 5/025 365/230.03 |
| 6,118,726 | A | * | 9/2000 | Ji | G11C 8/10 365/230.03 |

(Continued)

FOREIGN PATENT DOCUMENTS

KR 100915815 B1 9/2009

*Primary Examiner* — Viet Q Nguyen
(74) *Attorney, Agent, or Firm* — William Park & Associates Ltd.

(57) ABSTRACT

A semiconductor device is disclosed. The semiconductor device includes a first cell array and a second cell array, a first main word line disposed over the first cell array, a second main word line disposed over the second cell array, and a row decoder block disposed between the first cell array and the second cell array, and configured to include a common signal line that is commonly coupled to the first main word line and the second main word line such that a main word line control signal is simultaneously supplied to the first main word line and the second main word line.

20 Claims, 6 Drawing Sheets

(56) References Cited

U.S. PATENT DOCUMENTS

| | | | | |
|---|---|---|---|---|
| 6,209,056 B1* | 3/2001 | Suh | G11C 5/025 | 711/5 |
| 6,256,254 B1* | 7/2001 | Kwak | G11C 8/10 | 365/230.03 |
| 6,452,860 B2* | 9/2002 | Wada | G11C 5/063 | 365/230.06 |
| 6,466,504 B1* | 10/2002 | Roy | G11C 7/20 | 365/185.29 |
| 6,735,107 B1* | 5/2004 | Takashima | G11C 11/22 | 365/145 |
| 7,349,233 B2* | 3/2008 | Bains | G11C 8/12 | 365/189.02 |
| 7,633,788 B2* | 12/2009 | Choi | G11C 8/08 | 365/148 |
| 7,733,734 B2 | 6/2010 | Song | | |
| 9,418,711 B2 | 8/2016 | Ohgami | | |
| 10,331,379 B2* | 6/2019 | Ware | G06F 3/0613 | |
| 10,347,321 B1* | 7/2019 | Yamanaka | G11C 8/14 | |
| 2001/0048631 A1* | 12/2001 | Wada | G11C 5/063 | 365/230.03 |
| 2003/0072201 A1* | 4/2003 | Inaba | G11C 7/12 | 365/200 |
| 2003/0117826 A1* | 6/2003 | Karasawa | G11C 5/025 | 365/63 |
| 2003/0128607 A1* | 7/2003 | Miyashita | G11C 7/12 | 365/203 |
| 2006/0221691 A1* | 10/2006 | Ha | G11C 5/025 | 365/185.11 |
| 2007/0104012 A1* | 5/2007 | Sunaga | G11C 7/08 | 365/230.03 |
| 2008/0008024 A1* | 1/2008 | Mae | G11C 8/12 | 365/230.03 |
| 2009/0073797 A1* | 3/2009 | Song | G11C 8/08 | 365/230.03 |
| 2009/0080273 A1* | 3/2009 | Sohn | G11C 29/808 | 365/200 |
| 2009/0244077 A1* | 10/2009 | Sato | G09G 5/39 | 345/531 |
| 2014/0376323 A1* | 12/2014 | Terada | G11C 11/4087 | 365/230.03 |

* cited by examiner

SEMICONDUCTOR DEVICE

CROSS-REFERENCE TO RELATED APPLICATION

The priority of Korean patent application No. 10-2018-0118040 filed on Oct. 4, 2018, the disclosure of which is hereby incorporated in its entirety by reference, is claimed.

BACKGROUND

1. Technical Field

Embodiments of the present disclosure generally relate to a semiconductor device, and more particularly to a row decoder block.

2. Related Art

A semiconductor memory device is implemented using a semiconductor material such as silicon (Si), germanium (Ge), gallium arsenide (GaAs), indium phosphide (InP), etc. Semiconductor memory devices are generally classified into a volatile memory device and a non-volatile memory device.

Generally, the semiconductor memory device may be divided into a plurality of banks. In addition, each bank may include a plurality of mats, and each mat may include a memory cell array.

The semiconductor memory device may include main word lines and sub word lines formed to have a hierarchical structure. For example, word lines coupled to row-directional memory cells may be coupled to sub word lines, and the sub word lines may be coupled to the main word lines. The main word lines may be coupled to a row decoder.

The row decoder may supply a main-word-line control signal to memory banks through the main word lines.

SUMMARY

In accordance with an aspect of the present disclosure, a semiconductor device may include a first bank and a second bank, each of which includes a plurality of cell arrays, a first main word line disposed over the first bank, a second main word line disposed over the second bank, and a row decoder block disposed between the first bank and the second bank. The row decoder block may include a unit row decoder and a common signal line. The unit row decoder may output a main word line control signal based on a row address. The common signal line may be formed in a line type that extends in a first direction over the unit row decoder, and may simultaneously transmit the main word line control signal to the first main word line and the second main word line.

In accordance with an aspect of the present disclosure, a semiconductor device may include a first bank and a second bank, each of which includes a plurality of cell arrays, a plurality of first main word lines disposed over the first bank, a plurality of second main word lines disposed over the second bank, and a row decoder block disposed between the first bank and the second bank, and configured to include multiple common signal lines that are commonly coupled to the first main word lines and the second main word lines disposed in the same row such that a main word line control signal is simultaneously supplied to a corresponding first main word line and a corresponding second main word line.

In accordance with an aspect of the present disclosure, a semiconductor device may include a first cell array and a second cell array, a first main word line disposed over the first cell array, a second main word line disposed over the second cell array, and a row decoder block disposed between the first cell array and the second cell array, and configured to include a common signal line that is commonly coupled to the first main word line and the second main word line such that a main word line control signal is simultaneously supplied to the first main word line and the second main word line.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts. It is to be understood that the detailed description which will be disclosed along with the accompanying drawings is intended to describe the examples of embodiments of the present disclosure, and is not intended to describe a unique embodiment through which the present disclosure can be carried out. Hereinafter, the detailed description includes matters to provide full understanding of the present disclosure. However, it will be apparent to those skilled in the art that the present disclosure can be carried out without such matters. In some instances, well-known structures and devices are omitted in order to avoid obscuring the concepts of the present disclosure and the important functions of the structures and devices are illustrated in block diagram form.

Various embodiments of the present disclosure may be directed to providing a semiconductor device that substantially obviates one or more problems due to limitations and disadvantages of the related art.

Figure 1:
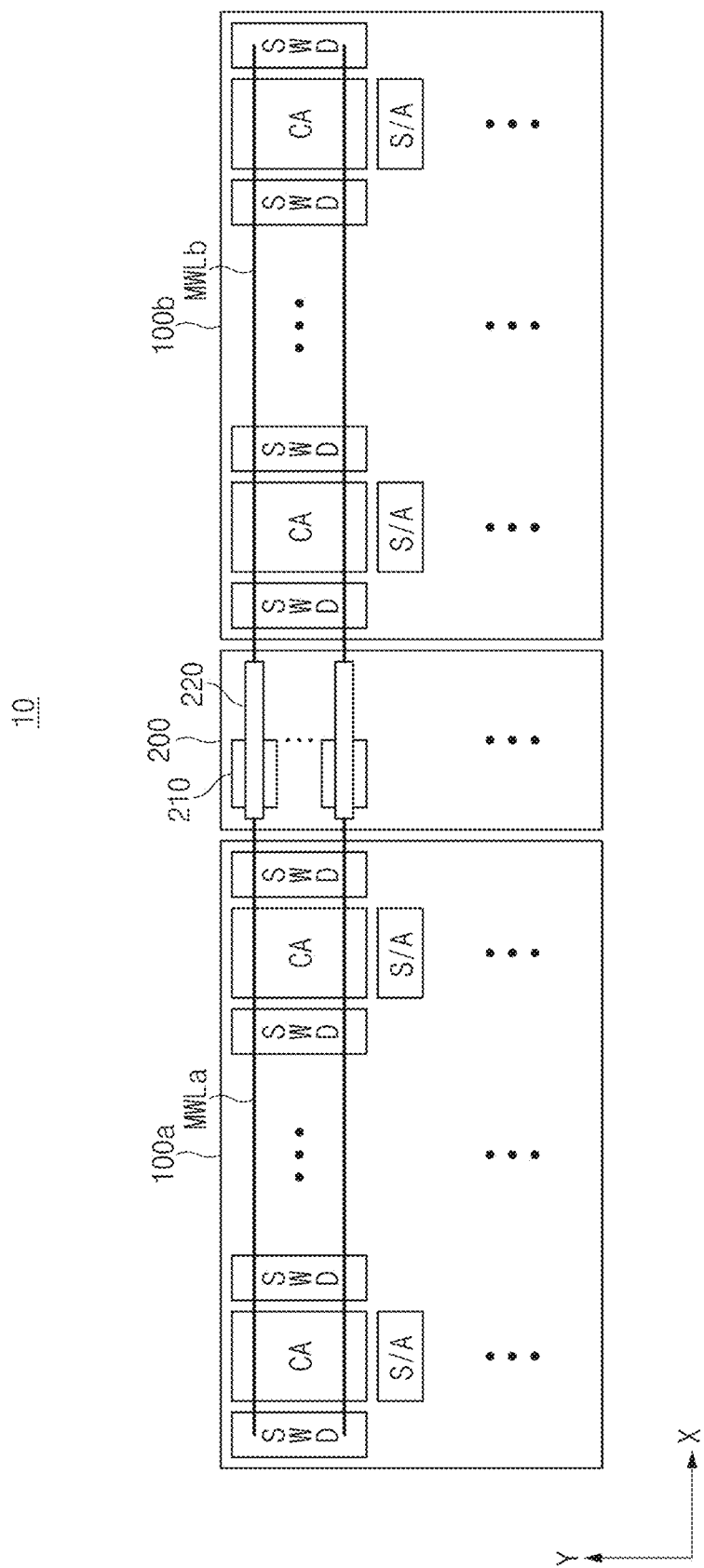
FIG. 1 is a schematic diagram illustrating a representation of an example of a semiconductor device according to an embodiment of the present disclosure.

An embodiment of the present disclosure may relate to a semiconductor device capable of reducing a chip size by improving a layout structure of a row decoder FIG. 1 is a schematic diagram illustrating a semiconductor device 10 according to an embodiment of the present disclosure.

Referring to FIG. 1, the semiconductor device 10 may include a plurality of memory banks 100a and 100b and a row decoder block 200.

Each of the memory banks 100a and 100b may include a plurality of cell arrays (CAs) arranged in a first direction (X-axis direction) and a second direction (Y-axis direction) in a matrix shape. Each cell array CA may include a plurality of memory cells storing data therein. Sub word line drivers (SWDs) for selectively activating word lines of each cell array CA may be disposed at both sides of each cell array CA. The memory banks 100a and 100b may respectively include main word lines MWLa and MWLb. Each of the main word lines MWLA and MWLB may couple the row decoder block 200 to the sub word line driver SWD, and may provide a main word line control signal (e.g., a main word line bar signal) to the sub word line driver SWD.

The row decoder block 200 may be disposed between two memory banks 100a and 100b, and may transmit the main word line control signal MWLB to both memory banks 100a and 100b according to a row address. For example, two memory banks 100a and 100b may share only one row decoder block 200 interposed between the two memory banks 100a and 100b, and may simultaneously receive or substantially simultaneously receive the main word line control signal MWLB from the single row decoder block 200.

The row decoder block 200 may include a plurality of unit row decoders 210 and common signal lines 220. Each of the unit row decoders 210 may output the main word line control signal MWLB according to a row address. The common signal lines 220 may simultaneously transmit the main word line control signals MWLB generated from the unit row decoders 210 to the memory banks 100a and 100b.

In this case, the common signal lines 220 may be formed to linearly extend in the first direction, such that the common signal lines 220 may be commonly coupled to the main word lines MWLa and MWLb of the memory banks 100a and 100b located at both sides of the row decoder block 200. For example, one end of each common signal line 220 may be coupled to the main word line MWLa of the memory bank 100a, and the other end of each common signal line 220 may be coupled to the main word line MWLb of the memory bank 100b. FIG. 1 also illustrates sense amplifiers S/A.

Figure 2:
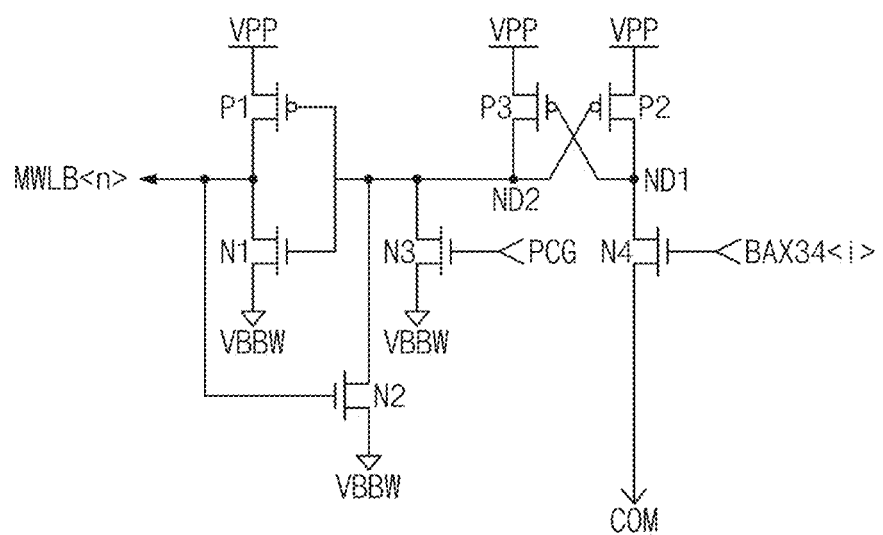
FIG. 2 is a circuit diagram illustrating a representation of an example of a circuit structure of each unit row decoder designed to output a main word line signal (MWLB) in a row decoder block shown in FIG. 1 according to an embodiment of the present disclosure.

FIG. 2 is a circuit diagram illustrating a circuit structure of each unit row decoder 210 designed to output the main word line control signal MWLB in the row decoder block 200 illustrated in FIG. 1 according to an embodiment of the present disclosure.

Referring to FIG. 2, in the unit row decoder 210, a pumping voltage VPP may be used as a pull-up voltage, and a back-bias voltage VBBW indicating a negative (−) voltage may be used as a pull-down voltage. In this case, the pumping voltage VPP and the back-bias voltage VBBW may be generated in the memory device. The pumping voltage VPP may be higher in level than a power-supply voltage VDD, and the back-bias voltage VBBW may be lower in level than a ground voltage VSS.

The unit row decoder 210 may generate a main word line control signal MWLB<n> according to a drive state of a control node ND1 and a precharge signal PCG, and may output the generated main word line control signal MWLB<n>. In this case, the drive state of the control node ND1 may be determined according to the precharge signal PCG and a block address signal BAX34<i>.

The unit row decoder 210 may include PMOS transistors P1, P2, and P3 and NMOS transistors N1, N2, N3, and N4.

The PMOS transistor P1 and the NMOS transistor N1 may be coupled in series between the pumping voltage VPP and the back-bias voltage VBBW, and a gate terminal of the PMOS transistor P1 and a gate terminal of the NMOS transistor N1 may be commonly coupled to a preliminary drive node ND2. The PMOS transistor P1 and the NMOS transistor N1 may operate as an inverter which outputs the main word line control signal MWLB<n> by inverting an output signal of the preliminary drive node ND2.

The NMOS transistor N2 may be coupled between the preliminary drive node ND2 and the back-bias voltage VBBW, and may be turned on or off according to the main word line control signal MWLB<n>. The NMOS transistor N3 may be coupled between the preliminary drive node ND2 and the back-bias voltage VBBW, and may be turned on or off according to the precharge signal PCG. The PMOS transistor P2 may be coupled between the pumping voltage VPP and the control node ND1, and a gate terminal of the PMOS transistor P2 may be coupled to the preliminary drive node ND2. The PMOS transistor P3 may be coupled between the pumping voltage VPP and the preliminary drive node ND2, and a gate terminal of the PMOS transistor P3 may be coupled to the control node ND1. The NMOS transistor N4 may be coupled between the control node ND1 and a common node COM, and may be turned on or off according to a block address signal BAX34<i>.

The operation principles of the above-mentioned unit row decoder 210 may be similar to those of a conventional row decoder, and the present disclosure is characterized in a layout structure of such row decoders, such that a detailed description of the operation principles of the unit row decoder 210 will herein be omitted for convenience of description.

Figure 3:
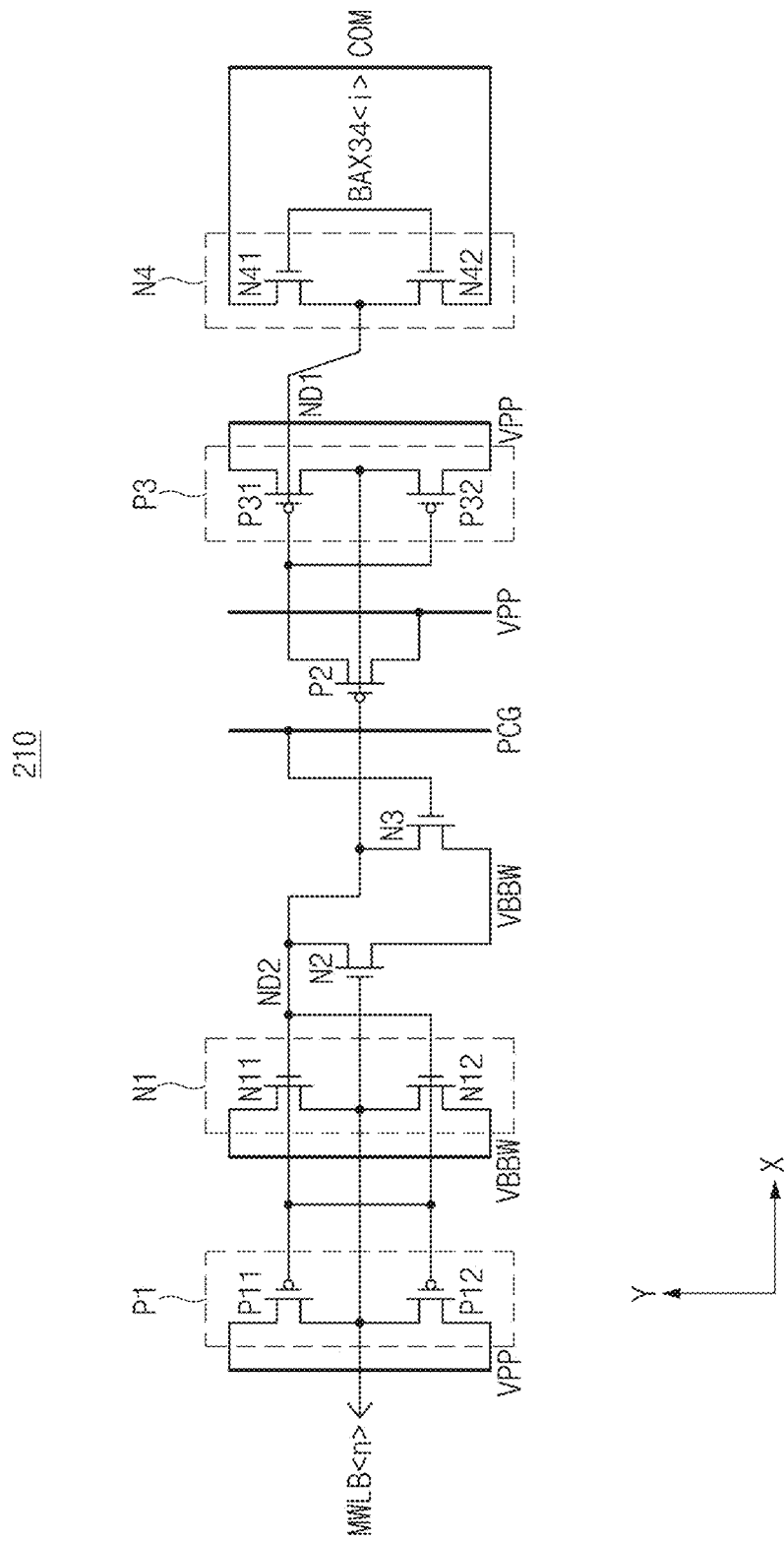
FIG. 3 is a circuit diagram illustrating rearrangement of the circuit structure shown in FIG. 2 according to an embodiment of the present disclosure.

FIG. 3 is a circuit diagram illustrating rearrangement of the circuit structure illustrated in FIG. 2 according to an embodiment of the present disclosure. For example, FIG. 3 is a circuit diagram illustrating rearrangement of the circuit structure illustrated in FIG. 2 in consideration of the relationship of physical positions of the transistors P1~P3 and N1~N4.

Referring to FIGS. 2 and 3, the PMOS transistor P1 may be implemented as two PMOS transistors P11 and P12 that are coupled in parallel between the pumping voltage VPP and an output terminal of the main word line control signal MWLB<n>. For example, gate terminals of the PMOS transistors P11 and P12 may be commonly coupled to the preliminary drive node ND2, first terminals (e.g., source terminals) of the PMOS transistors P11 and P12 may be commonly coupled to the pumping voltage VPP, and second terminals (e.g., drain terminals) of the PMOS transistors P11 and P12 may be commonly coupled to the output terminal of the main word line control signal MWLB<n>. The PMOS transistors P11 and P12 may be arranged in parallel in the second direction. The PMOS transistors P11 and P12 may be formed to have the same size having the same operation characteristics.

The NMOS transistor N1 may be implemented as two NMOS transistors N11 and N12 that are coupled in parallel between the back-bias voltage VBBW and the output terminal of the main word line control signal MWLB<n> and are arranged in parallel in the second direction. For example, gate terminals of the NMOS transistors N11 and N12 may be commonly coupled to the preliminary drive node ND2, first terminals of the NMOS transistors N11 and N12 may be commonly coupled to the back-bias voltage VBBW, and second terminals of the NMOS transistors N11 and N12 may be commonly coupled to the output terminal of the main word line control signal MWLB<n>. The NMOS transistors N11 and N12 may be located adjacent to the PMOS transistors P11 and P12 in the first direction. The NMOS transistors N11 and N12 may be formed to have the same size having the same operation characteristics.

The NMOS transistor N2 may be located adjacent to the NMOS transistors N11 and N12 in the first direction. The NMOS transistor N3 may be located adjacent to the NMOS transistor N2 in the first direction. A first terminal of the NMOS transistor N2 and a first terminal of the NMOS transistor N3 may be commonly coupled to the back-bias voltage VBBW. A second terminal of the NMOS transistor N2 and a second terminal of the NMOS transistor N3 may be commonly coupled to the preliminary drive node ND2. A gate terminal of the NMOS transistor N2 may be coupled to the output terminal of the main word line control signal MWLB<n>. A gate terminal of the NMOS transistor N3 may be coupled to the precharge signal PCG.

The PMOS transistor P2 may be located adjacent to the NMOS transistor N3 in the first direction. A first terminal of the PMOS transistor P2 may be coupled to the pumping voltage VPP, and gate terminals of PMOS transistors P31 and P32 may be commonly coupled to a second terminal of the PMOS transistor P2. A gate terminal of the PMOS transistor P2 may be coupled not only to the second terminal of the NMOS transistor N3 but also to second terminals of the PMOS transistors P31 and P32.

The PMOS transistor P3 may be implemented as two PMOS transistors P31 and P32 that are coupled in parallel between the pumping voltage VPP and the preliminary drive node ND2 and are arranged in parallel in the second direction. For example, first terminals of the PMOS transistors P31 and P32 may be commonly coupled to the pumping voltage VPP, second terminals of the PMOS transistors P31 and P32 may be commonly coupled to the preliminary drive node ND2, and gate terminals of the PMOS transistors P31 and P32 may be commonly coupled to the control node ND1. The PMOS transistors P31 and P32 may be located adjacent to the PMOS transistor P2 in the first direction. The PMOS transistors P31 and P32 may be formed to have the same size having the same operation characteristics.

The NMOS transistor N4 may be implemented as two NMOS transistors N41 and N42 that are coupled in parallel between the control node ND1 and a common node COM and are arranged in parallel in the second direction. For example, first terminals of the NMOS transistors N41 and N42 may be commonly coupled to the common node COM, second terminals of the NMOS transistors N41 and N42 may be commonly coupled to the control node ND1, and gate terminals of the NMOS transistors N41 and N42 may be commonly coupled to an input terminal of the block address signal BAX34<i>. The NMOS transistors N41 and N42 may be located adjacent to the PMOS transistors P31 and P32 in the first direction. The NMOS transistors N41 and N42 may be formed to have the same size having the same operation characteristics.

Figure 4:
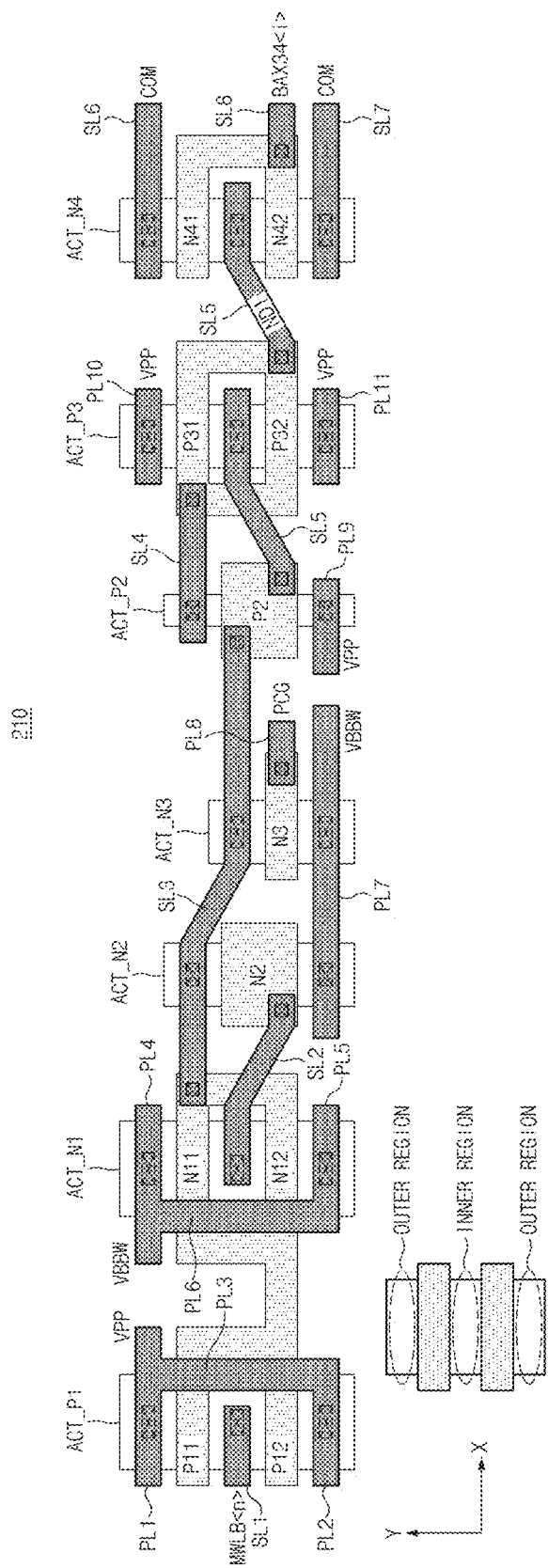
FIG. 4 is a layout diagram illustrating physical arrangement of the unit row decoder according to an embodiment of the present disclosure.

FIG. 4 is a layout diagram illustrating physical arrangement of the unit row decoder according to an embodiment of the present disclosure. For example, FIG. 4 illustrates a physical arrangement structure of transistors for use in the circuit structure illustrated in FIG. 3.

For convenience of description and better understanding of the present disclosure, identification (ID) symbols of the transistors illustrated in FIG. 3 are represented in gate terminals of the corresponding transistors as illustrated in FIG. 4.

Referring to FIG. 4, active regions ACT_P1~ACT_P3 and ACT_N1~ACT_N4 in which transistors P1~P3 and N1~N4 of the unit row decoder 210 are formed may be linearly arranged in the first direction, and may be formed in a rectangular shape extending in the second direction.

The PMOS transistors P11 and P12 may be formed in the same active region ACT_P1, gates of the PMOS transistors P11 and P12 may be arranged in parallel to one active region ACT_P1, and one terminal of the PMOS transistor P11 may be coupled to one terminal of the PMOS transistor P12, such that the gates of the PMOS transistors P11 and P12 may be formed in a two-finger shape. In the active region ACT_P1, an inner region (i.e., the center part of the active region ACT_P1 in FIG. 4) between the gates of the PMOS transistors P11 and P12 may be coupled to a signal line SL1 through which the main word line control signal MWLB<n> is output, and outer regions (i.e., both ends of the active region ACT_P1 in FIG. 4) of the gates of the PMOS transistors P11 and P12 may be respectively coupled to power lines PL1 and PL2, each of which outputs the pumping voltage VPP. In this case, the signal line SL1 and the power lines PL1 and PL2 may be formed of metal lines disposed in an M0 layer. For example, the power lines PL1 and PL2 according to an embodiment may be coupled to each other through a metal line PL3 disposed in the same layer (M0 layer). That is, both ends of the active region ACT_P1 may be commonly coupled to each other by metal lines of the same layer (M0 layer).

The active region ACT_N1 in which NMOS transistors N11 and N12 are formed may be located at one side of the active region ACT_P1 in the first direction. The gates of the NMOS transistors N11 and N12 may be arranged in parallel to one active region ACT_N1, and both ends of the NMOS transistors N11 and N12 are coupled to each other, resulting in formation of a two-finger shape. For example, both ends of the gates of the NMOS transistors N11 and N12 may be integrated with each other, resulting in formation of a rectangular ring shape. The gates of the NMOS transistors N11 and N12 may be integrated with the gates of the PMOS transistors P11 and P12. In the active region ACT_N1, an inner region (i.e., the center part of the active region ACT_N1 in FIG. 4) between the gates of the NMOS transistors N11 and N12 may be coupled to a signal line SL2 through which the main word line control signal MWLB<n> is output, and outer regions (i.e., both ends of the active region ACT_N1 in FIG. 4) of the gates of the NMOS transistors N11 and N12 may be respectively coupled to power lines PL4 and PL5, each of which outputs the back-bias voltage VBBW. In this case, the signal line SL2 and the power lines PL4 and PL5 may be formed of metal lines disposed in an M0 layer. For example, the power lines PL4 and PL5 according to an embodiment may be coupled to each other through a metal line PL6 disposed in the same layer (M0 layer). That is, both ends of the active region ACT_N1 may be commonly coupled to each other by metal lines formed in the same layer (M0 layer).

The active region ACT_N2 in which the NMOS transistor N2 is formed may be located at one side of the active region ACT_N1 in the first direction. The active region ACT_N3 in which the NMOS transistor N3 is formed may be located at one side of the active region ACT_N2, and the active region ACT_P2 in which the PMOS transistor P2 is formed may be located at one side of the active region ACT_N3.

A gate formed in the active region ACT_N2 may be coupled to the signal line SL2. One terminal of the active region ACT_N2 and one terminal of the active region ACT_N3 may be coupled to a power line PL7 through which the back-bias voltage VBBW is supplied, and the other terminal of the active region ACT_N2 and the other terminal of the active region ACT_N3 may be coupled to the gate of the PMOS transistor P2 and the gates of the NMOS transistors N11 and N12 through the signal line SL3. A gate formed in the active region ACT_N3 may be coupled to a power line PL8 through which a precharge voltage PCG is received. One terminal of the active region ACT_P2 may be coupled to a power line PL9 through which the pumping voltage VPP is supplied, and the other terminal of the active region ACT_P2 may be coupled to the gates of the PMOS transistors P31 and P32 through a signal line SL4. Signal lines SL3 and SL4 and power lines PL7, PL8, and PL9 may be formed of metal lines disposed in the same layer (M0 layer).

The active region ACT_P3 in which PMOS transistors P31 and P32 are formed may be located at one side of the active region ACT_P2 in the first direction, and the active region ACT_N4 in which NMOS transistors N41 and N42 are formed may be located at one side of the active region ACT_P3 in the first direction.

Gates of the PMOS transistors P31 and P32 may be formed as a two-finger shape in the same active region ACT_P3, and both ends of the gates of the PMOS transistors P31 and P32 may be coupled to each other, resulting in formation of a rectangular ring shape. The gates of the PMOS transistors P31 and P32 may be coupled to one end of the active region ACT_P2 through the signal line SL4, and may be coupled to the center part of the active region ACT_N4 through a signal line SL5. In the active region ACT_P3, an inner region (i.e., the center part of the active region ACT_P3 in FIG. 4) between the gates of the PMOS transistors P31 and P32 may be coupled to the gate formed in the active region ACT_P2 through the signal line SL5, and outer regions (i.e., both ends of the active region ACT_P3 in FIG. 4) of the gates of the PMOS transistors P31 and P32 may be respectively coupled to power lines PL10 and PL11, each of which outputs the pumping voltage VPP.

Gates of the NMOS transistors N41 and N42 may be formed as a two-finger shape in the active region ACT_N4. In the active region ACT_N4, an inner region (i.e., the center part of the active region ACT_N4 in FIG. 4) between the gates of the NMOS transistors P41 and P42 may be coupled to the signal line SL5, and outer regions (i.e., both ends of the active region ACT_N4 in FIG. 4) of the gates of the NMOS transistors P41 and P42 may be coupled to the common node COM through signal lines SL6 and SL7. A gate of the active region ACT_N4 may be coupled to a signal line SL8 through which a block address signal BAX34<i> is received.

The signal lines SL5, SL6, SL7, and SL8 and the power lines PL10 and PL11 may be made of metal lines formed in M0 layer.

Figure 5:
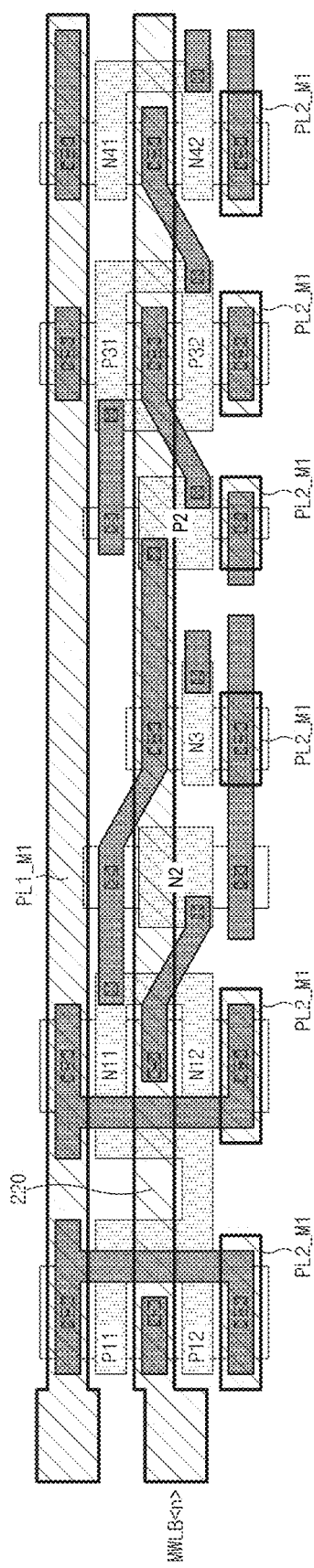
FIG. 5 is a layout diagram illustrating physical arrangement of the unit row decoder according to an embodiment of the present disclosure.

FIG. 5 is a layout diagram illustrating physical arrangement of the unit row decoder according to an embodiment of the present disclosure. For example, FIG. 5 is a view illustrating that metal lines of an M1 layer are additionally formed in the layout diagram of FIG. 4.

Referring to FIG. 5, a common signal line 220 for transmitting the main word line control signal MWLB<n> generated from the unit row decoder 210 to the memory banks 100a and 100b may be formed over the unit row decoder 210 of FIG. 4. The common signal line 220 may be formed of a metal line disposed in an M1 layer, and may be formed in a straight line type which traverses the unit row decoder in the first direction over the unit row decoder. The common signal line 220 may be coupled to signal lines SL1 and SL2 of the M0 layer through which the main word line control signal MWLB<n> is transmitted.

As illustrated in FIG. 1, the common signal line 220 may be commonly coupled to the main word line MWLa of the memory bank 100a and the main word line MWLb of the memory bank 100b, such that the common signal line 220 may simultaneously transmit the main word line control signal MWLB<n> to the memory banks 100a and 100b.

Power lines PL1_M1 and PL2_M1 for respectively supplying power-supply voltages VPP and VBBW to the unit row decoder 210 may be formed at both sides of the common signal line 220. In this case, the power line PL1_M1 formed at one side of the common signal line 220 may be formed in a manner that one power line traversing the unit row decoder 210 is formed to extend in the first direction in parallel or substantially in parallel to the common signal line 220. The power line PL2_M1 formed at the other side of the common signal line 220 may be formed in a manner that several island-type power lines are successively arranged in parallel or substantially in parallel to the common signal line 220 in the first direction. The power lines PL1_M1 and PL2_M1 may be formed of metal lines disposed in the M1 layer, and may be formed in a straight line type which is formed to extend in parallel to the common signal line 220 in the first direction. For example, the power line PL1_M1 located at one side of the common signal line 220 may be formed in a straight line type that has a substantially same length as the common signal line 220.

Figure 6:
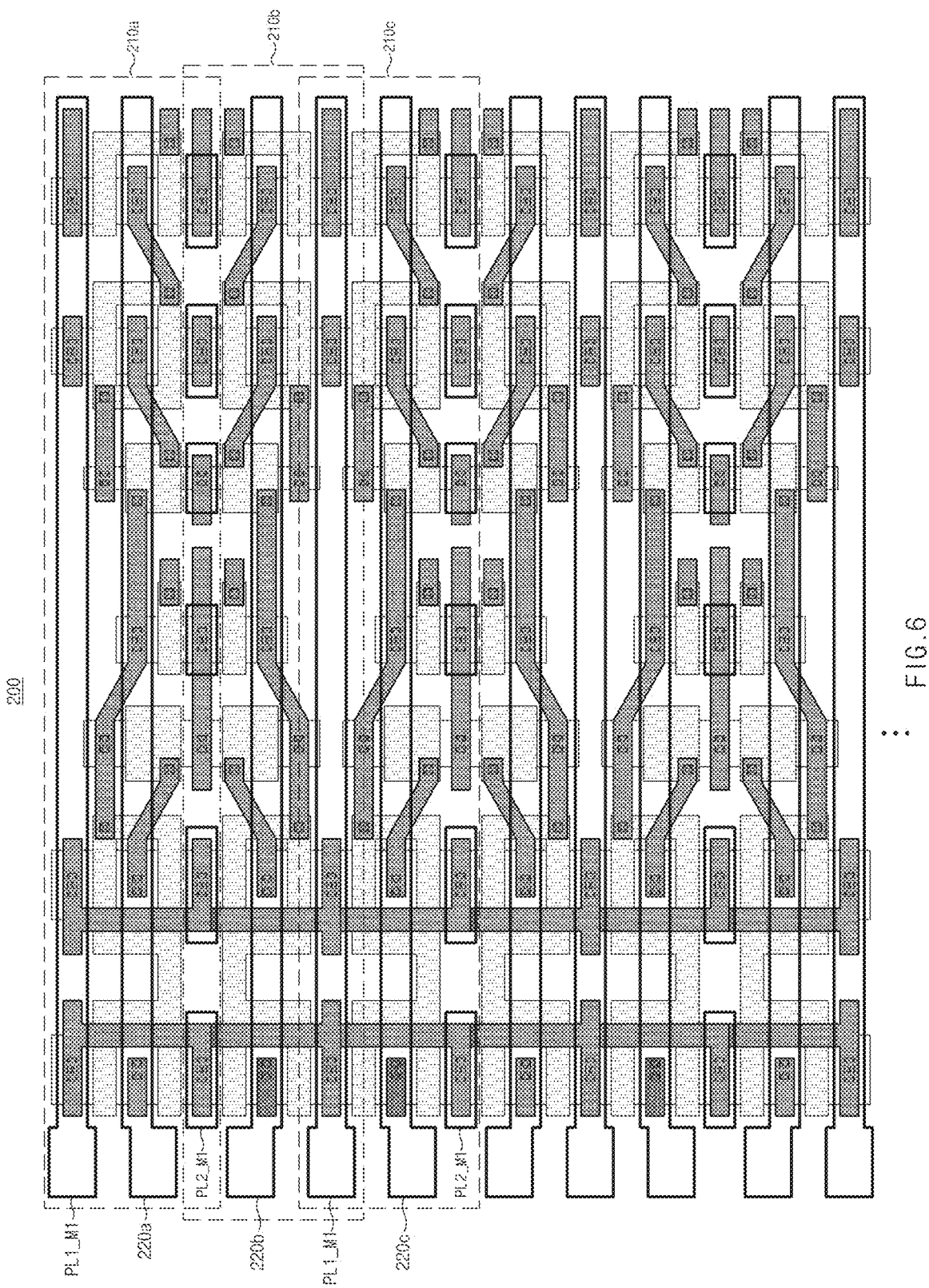
FIG. 6 is a schematic diagram illustrating that the unit row decoders illustrated in FIG. 5 are successively arranged in an array shape according to an embodiment of the present disclosure.

FIG. 6 is a schematic diagram illustrating that the unit row decoders illustrated in FIG. 5 are successively arranged in an array shape according to an embodiment of the present disclosure.

Referring to FIG. 6, unit row decoders contiguous to each other may share the power line PL1_M1 or PL2_M1. For example, the unit row decoders 210a and 210b may share the power line PL2_M1, and the unit row decoders 210b and 210c may share the power line PL1_M1.

The common signal lines 220 of the contiguous unit row decoders may be symmetrically arranged in the second direction. For example, the common signal line 220a of the unit row decoder 210a and the common signal line 220b of the unit row decoder 210b may be symmetrical or substantially symmetrical to each other, and the common signal line 220b of the unit row decoder 210b and the common signal line 220c of the unit row decoder 210c may be symmetrical or substantially symmetrical to each other.

As is apparent from the above description, the semiconductor device according to the embodiments of the present disclosure may reduce a chip size by improving a layout structure of a row decoder, resulting in improvement in net dies.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a first bank and a second bank, each of which includes a plurality of cell arrays;
   a first main word line disposed over the first bank;
   a second main word line disposed over the second bank; and
   a row decoder block disposed between the first bank and the second bank,
   wherein the row decoder block includes
      a unit row decoder configured to output a main word line control signal based on a row address;
      a common signal line formed in a line type that extends in a first direction over the unit row decoder, and configured to simultaneously transmit the main word line control signal to the first main word line and the second main word line; and
      a plurality of power lines configured to supply a power-supply voltage to the unit row decoder, and located in the same layer as in the common signal line.

2. The semiconductor device according to claim 1, wherein the
   power lines located at both sides of the common signal line.

3. The semiconductor device according to claim 2, wherein the power lines include:
   a first power line located at one side of the common signal line, and configured to allow a single line traversing the unit row decoder to extend substantially parallel to the common signal line; and
   a plurality of second power lines located at the other side of the common signal line, and configured to allow a plurality of island-type lines to be successively arranged substantially parallel to the common signal line.

4. The semiconductor device according to claim 1, wherein the unit row decoder includes:
   a first p-channel metal oxide semiconductor (PMOS) transistor and a second PMOS transistor coupled in parallel between a first voltage and an output terminal of a main word line control signal, and configured in a manner that a gate terminal of the first PMOS transistor and a gate terminal of the second PMOS transistor are commonly coupled to a first node; and
   a first n-channel metal oxide semiconductor (NMOS) transistor and a second NMOS transistor coupled in parallel between a second voltage and an output terminal of the main word line control signal, and configured in a manner that a gate terminal of the first NMOS transistor and a gate terminal of the second NMOS transistor are commonly coupled to the first node.

5. The semiconductor device according to claim 4, wherein each of the first PMOS transistor and the second PMOS transistor includes:
   a first gate and a second gate arranged substantially in parallel in a single first active region, and configured in a manner that one end of the first gate and one end of the second gate are coupled to each other; and
   in the first active region, an inner region between the first gate and the second gate is coupled to an output terminal of the main word line control signal, and outer regions of the first gate and the second gate are coupled to the first voltage,
   wherein the outer regions of the first gate and the second gate are commonly coupled to each other by a third power line located in a layer lower than the common signal line.

6. The semiconductor device according to claim 5, wherein each of the first NMOS transistor and the second NMOS transistor includes:
   a third gate and a fourth gate arranged substantially in parallel in a single second active region, and configured in a manner that one end of the third gate and one end of the fourth gate are coupled to each other; and
   in the second active region, an inner region between the third gate and the fourth gate is coupled to an output terminal of the main word line control signal, and outer regions of the third gate and the fourth gate are coupled to the second voltage,
   wherein the outer regions of the third gate and the fourth gate are commonly coupled to each other by a fourth power line located in a layer lower than the common signal line.

7. The semiconductor device according to claim 6, wherein the third power line and the fourth power line are located in the same layer.

8. The semiconductor device according to claim 7, wherein the first voltage is a pumping voltage, and the second voltage is a back-bias voltage.

9. The semiconductor device according to claim 6, wherein the first active region and the second active region are arranged substantially in parallel to each other while being located adjacent to each other in a first direction.

10. A semiconductor device comprising:
    a first bank and a second bank, each of which includes a plurality of cell arrays;
    a plurality of first main word lines disposed over the first bank;
    a plurality of second main word lines disposed over the second bank; and
    a row decoder block disposed between the first bank and the second bank, and configured to include multiple common signal lines that are commonly coupled to the first main word lines and the second main word lines disposed in the same row such that a main word line control signal is simultaneously supplied to a corresponding first main word line and a corresponding second main word line,
    wherein the row decoder block includes a plurality of power lines located in the same layer as in the common signal lines.

11. The semiconductor device according to claim 10, wherein the row decoder block includes:
    a plurality of unit row decoders located below the common signal lines in a manner that the unit row decoders correspond to the common signal lines on a one to one basis, and configured to output the main word line control signal based on a row address.

12. The semiconductor device according to claim 11, wherein the common signal lines are formed in a line type which traverses the corresponding unit row decoder in a first direction.

13. The semiconductor device according to claim 11, wherein the
power lines located at both sides of the common signal lines.

14. The semiconductor device according to claim 13, wherein the power lines include:
a first power line located at one side of the common signal lines, and configured to allow a single line traversing a corresponding unit row decoder to extend substantially parallel to the common signal lines; and
a plurality of second power lines located at the other side of the common signal lines, and configured to allow a plurality of island-type lines to be successively arranged substantially parallel to the common signal lines.

15. The semiconductor device according to claim 11, wherein each of the unit row decoders includes:
a first p-channel metal oxide semiconductor (PMOS) transistor and a second PMOS transistor coupled in parallel between a first voltage and an output terminal of a main word line control signal, and configured in a manner that a gate terminal of the first PMOS transistor and a gate terminal of the second PMOS transistor are commonly coupled to a first node; and
a first n-channel metal oxide semiconductor (NMOS) transistor and a second NMOS transistor coupled in parallel between a second voltage and an output terminal of the main word line control signal, and configured in a manner that a gate terminal of the first NMOS transistor and a gate terminal of the second NMOS transistor are commonly coupled to the first node.

16. The semiconductor device according to claim 15, wherein each of the first PMOS transistor and the second PMOS transistor includes:
a first gate and a second gate arranged substantially in parallel in a single first active region, and configured in a manner that one end of the first gate and one end of the second gate are coupled to each other; and
in the first active region, an inner region between the first gate and the second gate is coupled to an output terminal of the main word line control signal, and outer regions of the first gate and the second gate are coupled to the first voltage,
wherein the outer regions of the first gate and the second gate are commonly coupled to each other by a third power line located in a layer lower than the common signal line.

17. The semiconductor device according to claim 16, wherein each of the first NMOS transistor and the second NMOS transistor includes:
a third gate and a fourth gate arranged substantially in parallel in a single second active region, and configured in a manner that one end of the third gate and one end of the fourth gate are coupled to each other; and
in the second active region, an inner region between the third gate and the fourth gate is coupled to an output terminal of the main word line control signal, and outer regions of the third gate and the fourth gate are coupled to the second voltage,
wherein the outer regions of the third gate and the fourth gate are commonly coupled to each other by a fourth power line located in a layer lower than the common signal line.

18. The semiconductor device according to claim 17, wherein the third power line and the fourth power line are located in the same layer.

19. A semiconductor device comprising:
a first cell array and a second cell array;
a first main word line disposed over the first cell array;
a second main word line disposed over the second cell array; and
a row decoder block disposed between the first cell array and the second cell array, and configured to include a common signal line that is commonly coupled to the first main word line and the second main word line such that a main word line control signal is simultaneously supplied to the first main word line and the second main word line,
wherein the row decoder block includes a plurality of power lines located in the same layer as in the common signal line.

20. The semiconductor device according to claim 19, wherein the power lines include:
a first power line configured to supply a first power-supply voltage to the unit row decoder, and located in the same layer as in the common signal line at one side of the common signal line; and
a second power line configured to supply a second power-supply voltage to the unit row decoder, and located in the same layer as in the common signal line at another side of the common signal line opposite the one side.

* * * * *